United States Patent [19]

Mizushima

[11] Patent Number: 5,155,576

[45] Date of Patent: Oct. 13, 1992

[54] SEMICONDUCTOR INTEGRATED CIRCUIT HAVING A MULTILAYER WIRING STRUCTURE

[75] Inventor: Kazuyuki Mizushima, Tokyo, Japan

[73] Assignee: NEC Corporation, Tokyo, Japan

[21] Appl. No.: 675,946

[22] Filed: Mar. 27, 1991

[30] Foreign Application Priority Data

Mar. 28, 1990 [JP] Japan .................. 2-79260

[51] Int. Cl.[5] .......................................... H01L 23/54
[52] U.S. Cl. .................................... 357/71; 357/54
[58] Field of Search ............... 357/71, 54, 67

[56] References Cited

U.S. PATENT DOCUMENTS

| | | | |
|---|---|---|---|
| 4,040,083 | 8/1977 | Saiki et al. | 357/54 |
| 4,204,894 | 5/1980 | Komeda et al. | 357/54 |
| 4,561,009 | 12/1985 | Yonezawa et al. | 357/71 |

FOREIGN PATENT DOCUMENTS

| | | |
|---|---|---|
| 57-100748 | 6/1982 | Japan . |
| 58-124426 | 7/1983 | Japan . |
| 62-295437 | 12/1987 | Japan . |

Primary Examiner—Rolf Hille
Assistant Examiner—S. V. Clark
Attorney, Agent, or Firm—Burns, Doane, Swecker & Mathis

[57] ABSTRACT

A semiconductor integrated circuit is constituted, by forming selectively a first insulation film on a lower layer wiring metal; after covering a lateral wall of the lower layer wiring metal with a second insulation film, embedding a material having a low dielectric constant in the lower layer wiring so as to flatten the surface thereof. A third insulation film is formed over the entire surface, and through holes are made in the first and the third insulation films on the lower layer wiring so as to connect the lower layer wiring to the upper layer wiring through the through holes. Thus, it is possible to realize a layer insulation film having very good flatness, to realize a multilayer wiring having high reliability in which corrosions, etc., are not caused in the wiring metal containing through hole portions, and to make the coated films thicker, which films have a low dielectric constant and can be relatively easily formed, so that the wiring capacity can be decreased.

3 Claims, 4 Drawing Sheets

SEMICONDUCTOR INTEGRATED CIRCUIT HAVING A MULTILAYER WIRING STRUCTURE

BACKGROUND OF THE INVENTION

1. Field of the Invention

The present invention relates to a multilayer wiring (interconnection) structure of a semiconductor integrated circuit and a method for producing the same, and particularly to a structure of a layer insulation film for electrically separating wirings of different layers and a method for producing the same.

2. Description of the Prior Art

Heretofore, in a multilayer wiring structure of a semiconductor integrated circuit, as shown in FIG. 1(a), a lower layer wiring 502 is disposed on a semiconductor substrate 501. An insulation film 510 is formed on the lower layer wiring 502, and an upper layer wiring 509 is connected to the lower layer wiring 502 through a through hole 508 which is made in the insulation film 510. The insulation film 510 is for electrically separating the upper and lower layer wirings. Therefore a single layer or plural layers of an insulation film such as a silicon oxide film, a silicon nitride film and the like which is produced by a chemical vapor deposition (CVD) method or a plasma CVD method. In recent years, with miniaturization and multiplication of layers in wiring patterns, there has been used a structure in which, for the purpose of flattening a surface, as shown in FIG. 1(b), an insulation film 504 formed by coating, for example, a glass film, an organosilicon compound film, a polyimide film and the like, is combined with insulation films 503 and 505 obtained by a CVD method or a plasma CVD method to be applied to a part of a layer insulation film.

For a method for forming a multilayer wiring of a semiconductor integrated circuit, there has been adopted a method for forming a multilayer wiring by: depositing a lower layer wiring metal such as aluminium by a sputtering method, etc., on the semiconductor substrate 501 on which elements are formed and in which contact holes are made; executing patterning process to the wiring metal by a photo-etching technique so as to form element electrodes, the lower layer wiring 502 and the portion intended to make a through hole, simultaneously, thereafter, growing layer insulation film 501, for example, by a plasma CVD method; and after making a through hole 508 in the portion formed by the lower layer wiring material, which portion is intended to make a through hole, by the photo-etching technique, depositing an upper layer wiring metal thereon by, for example, a sputtering method and the like, and executing a patterning process to the deposit by the photo-etching technique thereby forming connection portions on the upper layer wiring 509 and the through hole 508, simultaneously, so as to connect the upper and the lower layers to each other through the through hole. In recent years, with miniaturization and multiplication of layers in wiring patterns, for the purpose of flattening the surface, an insulation film 504 formed by coating, for example, a glass film, an organosilicon compound film, a polyimide film and the like, is applied to a part or the whole of the layer insulation film. For example, in Japanese Patent Laid-open No. 100,748/82, No. 124,246/83, and No. 295,437/87, there is proposed a method in which a glass film formed by coating and a multilayer constitution of insulation films obtained by a CVD method or an $SiO_2$ film formed by coating an organosilicon compound is used.

In recent years, the increase in the operation speed is remarkable in integrated circuits. In active elements constituting the integrated circuit, the operation speed of the integrated circuit is adopted to be increased by decreasing parasitic resistance and increasing a cutt-off frequency by means of miniaturization of the size and the shallower junction of the p-n junction portion. However, even if the size of the element is miniaturized, the current required to the high speed operation cannot be decreased from a standpoint of the driving capability. Therefore, the thickness and the width of the wiring film cannot be decreased below the limit restricted with respect to the reliability due to resistance to electromigration, etc.

On the other hand, with the high speed operation, the rate of the signal delay within the chip has been increased due to the load of the wiring. The load of the wiring is determined by the resistance of the wiring itself and the parasitic capacitance of the wiring. In order to decrease the resistance of the wiring, a large cross sectional area of the wiring is required. This is an impediment to miniaturization. Also, in order to decrease the capacitance of the wiring, the dielectric constant of a layer insulation film is required to be low, below a certain limit for the reason described above. However, since all the properties demanded, such as insulation property, chemical stability, resistance to moisture, coating property and the like, must be satisfied in the layer insulation film of the integrated circuit, the material having low dielectric constant cannot be always used as a substitute for the CVD insulation film which is widely used.

Next, applying the CVD film is applied to the layer insulation film in the conventional method for forming the multilayer wiring is considered. Since the single layer of the CVD film generally has a property in which unevenness of the ground and the lower layer wiring is increased, when the thickness of the lower layer wiring metal is set to over 1.0 μm, the coating property of the upper layer wiring at the steps of the lower layer wiring deteriorates and the yield and reliability of the semiconductor integrated circuit drop. Also, it is difficult to miniaturize the circuit. The CVD films which are frequently used for layer insulation films of integrated circuits are a silicon nitride film, a silicon oxide film and the like. The dielectric constant $\epsilon'$ of the silicon nitride film is nearly equal to 8 and the dielectric constant $\epsilon'$ of the silicon oxide film is nearly equal to 4. Therefore, the wirings wiring capacitance tends to be an obstacle to a high speed operation.

On the other hand, when a glass film, an organosilicon compound film, a polyimide film or the like obtained by a coating method is applied to a part or the whole of the layer insulation film, excellent flatness can be realized. In these coated films, the dielectric constant $\epsilon'$ is generally smaller than that of the CVD film. The films of which dielectric constant $\epsilon'$ is equal to 2 to 3 can be easily obtained. Therefore, these coated films are also advantageous from a viewpoint of a wiring capacitance. When the film formed by coating has been exposed upon making a through hole for connecting the upper and lower layer wirings to each other, it is feared that moisture and the like are released due to dehydration condensation reaction of the coated film from the exposed portions and the wiring material suffers corrosion. Such films are short of stability and reliability. In order to avoid such disadvantages, when etching back process is applied to the coated film over the entire surface thereof for the film not to be left on the lower layer wiring, only the thickness of the coated film corresponding to the steps of the ground remains except for wiring portions. Therefore, sufficient use of the advantage of a small dielectric constant cannot be made.

SUMMARY OF THE INVENTION

The first object of the present invention is to provide a layer insulation film for a multilayer wiring structure which film is excellent in flatness, resistance to corrosion, chemical stability, etc. and has a low dielectric constant by constituting the multilayer wiring structure such that a film formed by coating is used so as to make the wiring capacity small, and the coated film is enclosed by a CVD insulation film at an area other than the wiring area.

The second object of the present invention is to provide a method for producing multilayer wiring structure in which there are removed disadvantages such as moisture release, deterioration of flatness, reduction of dielectric constant and so on which are accompanied by conventional coating techniques, by forming an insulation film just above a lower layer wiring and on a lateral surface, leaving coated films at areas other than wired areas, and further forming an insulation film over the whole surface.

A multilayer wiring structure of a semiconductor integrated circuit according to the present invention comprises: a lower layer wiring formed in a predetermined shape on a semiconductor substrate on which elements are formed; a first CVD insulation film formed in the same shape as said lower layer wiring; a second CVD insulation film covering at least a lateral portion of said lower layer wiring; a film having a low dielectric constant which is formed at an area other than the area of said lower layer wiring and a top surface of which film is formed substantially on a level with that of said first CVD insulation film; a third CVD insulation film covering the entire surface above said first CVD insulation film and said low dielectric constant film; and an upper layer wiring connected to said lower layer wiring through openings which are made, respectively, in said first CVD insulation film and said third CVD insulation film on said lower layer wiring.

A method for the production of a multilayer wiring structure of a semiconductor integrated circuit according to the present invention comprises the steps of: forming selectively a first insulation film only on a lower layer wiring metal disposed on a semiconductor substrate; covering at least a lateral wall of said lower layer wiring metal with a second insulation film; embedding a film formed by coating in an area other than said lower layer wiring area so as to flatten said area; etching said surface by reactive ion etching (RIE) processing until said first insulation film is exposed so as to remove at least the coated film on said lower layer wiring; growing a third insulation film on the entire surface of said substrate; and making througn holes in said first insulation film and said third insulation film, respectively, so as to deposit an upper layer wiring metal.

As described above, according to the present invention, it is possible to fill up deep recesses which were difficult to deal with in the past, to prevent the above-mentioned coated film from becoming exposed at the wiring connections and to easily realize an insulation film having a low dielectric constant, by using a coated film obtained by rotary coating or dehydration condensation reaction, for example, of prepolymer such as silicon glass, organosilicon compound, polyimide and the like, as a film having a low dielectric constant.

BRIEF DESCRIPTION OF THE DRAWINGS

The above and other objects, features and advantages of the present invention will become apparent from the following detailed description when taken with accompanying drawings in which.

DESCRIPTION OF THE PREFERRED EMBODIMENT

The present invention will be explained below further in detail with respect to some of its embodiments.

Figure 1A:
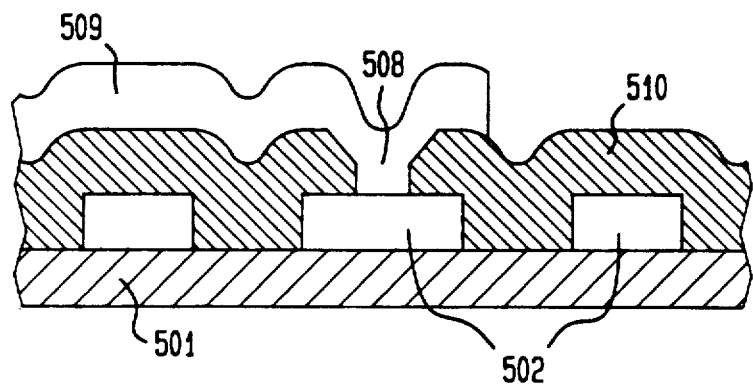
FIGS. 1(a) and 1(b) are longitudinal sections of a conventional wiring structure.
Figure 1B:
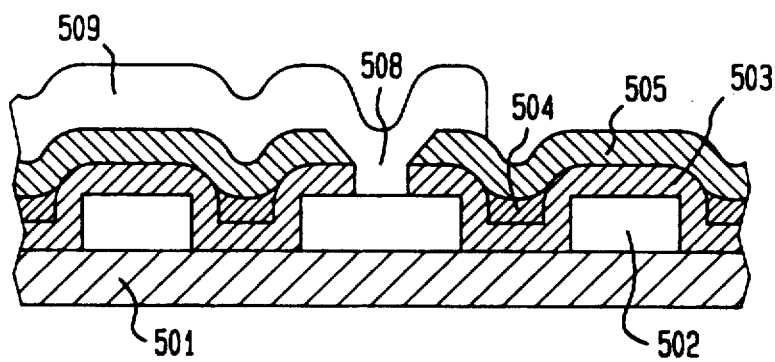
Figure 2:
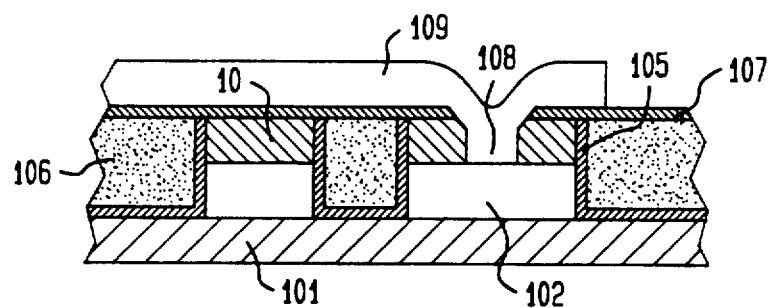
FIG. 2 is a longitudinal section of a first embodiment of a wiring structure according to the present invention.

FIG. 2 is a longitudinal section of a first embodiment of a multilayer wiring structure according to the present invention. A lower layer wiring is covered by a first insulation film 103 selectively deposited by a CVD method on a lower layer wiring metal 102 and a second insulation film 105 deposited by the CVD method over at least a lateral wall of the lower layer wiring metal 102 on a semiconductor substrate 101 on which elements are formed. Areas, in which the lower layer wirings do not exist, are filled with a material having a low dielectric constant $\epsilon'$, the value of which is equal to two to three. For example, a film 106 formed by coating such as a glass film, an organosilicon compound film, a polyimide film and the like. There is a third insulation film 107 is provided on the entire surface of the semiconductor substrate over the coated film 106 and the first insulation film 103. The coated film 106 is enclosed around the periphery thereof by the insulation films 103, 105 and 107. The lower layer wiring 102 and an upper layer wiring 109 are electrically connected to each other through a through hole 108 made in the first insulation film 103 and the third insulation film on the lower layer wiring 102. Owing to such a construction, the material having the low dielectric constant formed by coating, etc. and the wiring metal are never in direct contact with each other. Since a material having a low dielectric constant is embedded in areas where the lower layer wiring is not formed, it is possible to realize good flatness. Further, as for a wiring capacitance, upon comparing a case using a single layer of a silicon oxide film for a layer insulation film in the past, with a case in which a silicon oxide film is applied to the first, second and third insulation films and a polyimide film having a dielectric constant $\epsilon'=2$ is applied to the film having a low dielectric constant, according to the present invention, the mutual capacitance between lower layer wirings decreases by about 40% and the mutual capacitance between the lower and upper layer wirings decreases by about 15%, when the line/ space of the lower layer wiring is 2.0 μm/2.0 μm. The mutual capacitance between the upper layer wiring and the substrate decreases by about 30% in the wiring having the width of 2 μm, and the wiring load can be reduced remarkably.

A silicon oxide film, a silicon nitride film, a silicon oxynitride film and the like are suitable to the first, second and third CVD insulation films. When the lower layer wiring is 10,000 Å thick, the effectiveness of the present invention can be exhibited to the utmost extent by setting the thickness of the first insulation film to 8,000 to 10,000 Å, the thickness of the second insulation film to 2,000 Å at the flat portion and the thickness of the third insulation film to 1,000 to 2,000 Å, respectively.

Figure 3A:
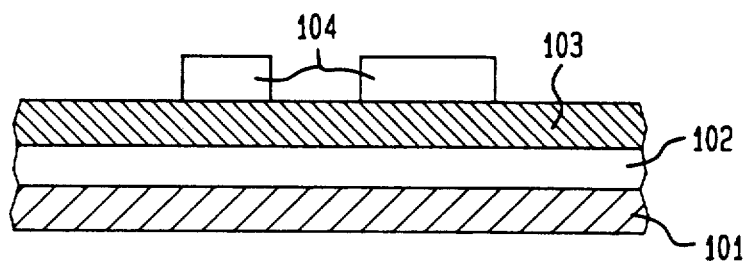
FIGS. 3(a) to 3(f) are sections showing process steps of a first embodiment of a method for producing a wiring structure according to the present invention.

Next a method for producing a multilayer wiring structure according to the embodiment of the present invention will now be described with reference to the drawings. FIGS. 3(a) to 3(f) show the longitudinal sections of the first embodiment the production method of the present invention, in order of production process steps of the method. After the lower layer wiring metal 102 such as aluminum and the like is deposited by a sputtering method on the semiconductor substrate 101 on which elements are formed, the first insulation film 103 is formed over the entire surface of the deposit. Then, a silicon oxide film and a silicon nitride film having chemical stability, respectively, are suitable to the insulation material, and the thickness of 5,000 to 10,000 Å is also suitable. As shown in FIG. 3(a), photoresist 104 is formed in desired shape of the lower layer wiring by photolithography for patterning of the lower layer wiring to be executed.

Figure 3B:
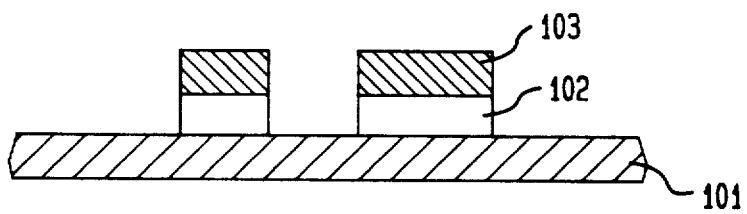
Figure 3C:
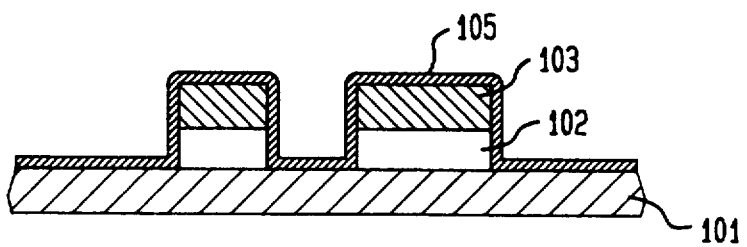

Next, by using the photoresist 104 as a mask, as shown in FIG. 3(b), the patterning process is executed to the first insulation film 103 and the lower layer wiring metal 102. The first insulation film might be etched by using the photoresiste as a mask, and then, the lower layer wiring metal might be etched by using the first insulation film as a mask. Next, as shown in FIG. 3(c), the second insulation film 105 is formed over the entire surface. Then a silicon oxide film and a silicon nitride film obtained by a CVD method are suitable to the insulation film, and the thickness of each film is about 1,000 to 2,000 Å. The purpose of the second insulation film is to cover the lateral wall of the lower layer wiring metal 102.

Figure 3D:
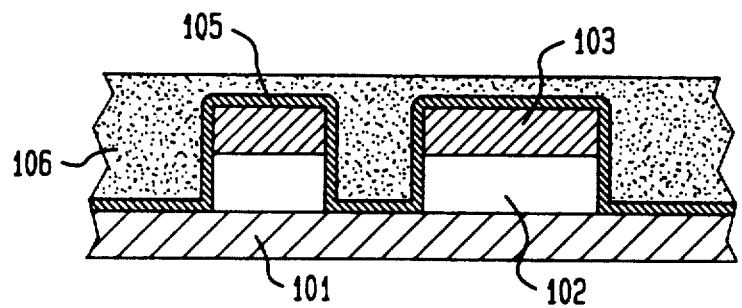
Figure 3E:
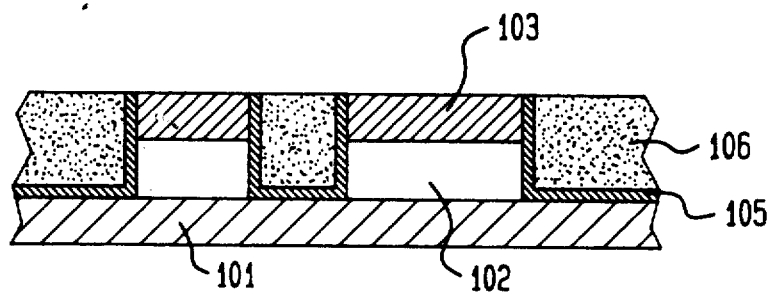

Next, as shown in FIG. 3(d), there is formed the film 106 formed by coating such as a silicon glass film, and organosilicon compound film, a polyimide film and the like by rotary coating and annealing. Very good flatness of the surface can be obtained by suitably selecting the viscosity of the coating suitably selecting the viscosity of the coating liquid and the number of revolution upon coating. Since the films formed by coating can obtain a low dielectric constant more easily than the CVD films, it is effective to form the coated films thick as the layer insulation film, for reduction of the wiring capacity. As shown in FIG. 3(e), all the films formed by coating on the lower layer wiring metal 102 are removed, by etching the entire surface of the coated films with a reactive ion etching (RIE) method for utilizing $CF_4$ or a mixed gas of $CF_4$ and $H_2$ and exposing the first insulation film 103 (etching back). Then, it is desirable for the surface flatness not to be damaged by bringing the etching selection ratio of the first and second insulation films and the films formed by coating close to 1. The extent of etching may be set such that the second insulation film 105 on the lower layer wiring metal 102 may be removed. Therefore, the films formed by coating 106 exist selectively at portions where the lower layer wiring metal 102 does not exist.

Figure 3F:
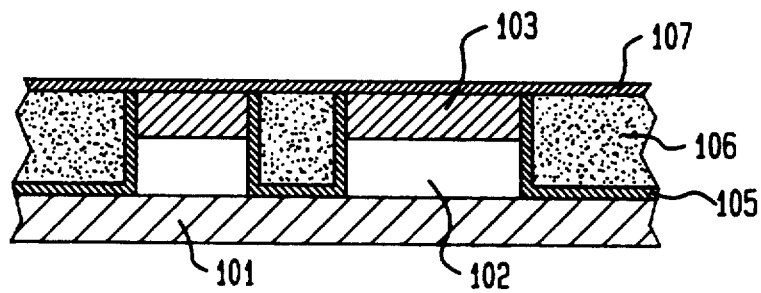

Next, as shown in FIG. 3(f), the thrid insulation film 107 is grown by the CVD method over the entire surface, like the first insulation film 103 and the second insulation film 105. Since it is necessary for the thrid insulation film to have the same etching characteristic of the through hole as that of the first insulation film, it is preferable that the third film is made of the same material as that of the first film and the thickness of the third film may be 2,000 Å.

Next, the structure of the present invention shown in FIG. 2 can be obtained by making through holes 108 in desired portions with a conventional photoetching technique, depositing the upper layer wiring metal 109 with a sputtering method, etc. and forming the upper layer wiring with patterning by the use of a photoetching method.

In the embodiment, etching was executed until the insulation film 103 was exposed upon etching back of the film 106 formed by coating. However, when using materials in which the etching selection ratios for the first, second and third insulation films 103, 105 and 107, respectively, are equal to one another or using the same material, etching back may be executed until the second insulation film 105 is exposed.

Figure 4:
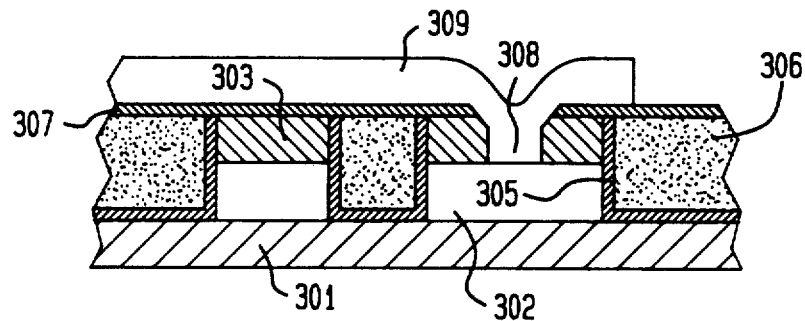
FIG. 4 is a longitudinal section of a second embodiment of the wiring structure according to the present invention.

FIG. 4 is a longitudinal section of a multilayer wiring structure according to a second embodiment of the present invention. In this embodiment, a second insulation film 305 is etched back and the second insulation film is completely removed on the flat portion so that the second film may be left only on the lateral portion of a lower layer wiring 302. In this embodiment a film 306 formed by coating having a low dielectric constant can be formed thicker, so that the wiring capacity can be further decreased. Even though a silicon nitride film, which is excellent in resistance to moisture but has a large dielectric constant, is applied to the second insulation film, there can be realized a multilayer wiring in which the increase of the wiring capacity is very small and the wiring load can be decreased under high reliability.

Next, the production method according to the present invention will now be described.

Figure 5A:
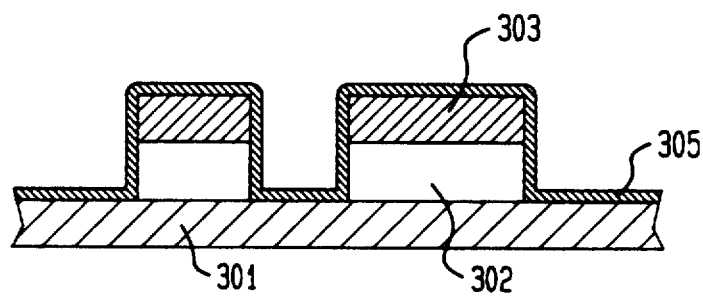
FIGS. 5(a) to 5(b) are sections showing process steps of a second embodiment of the method for producing the wiring structure according to the present invention.
Figure 5B:
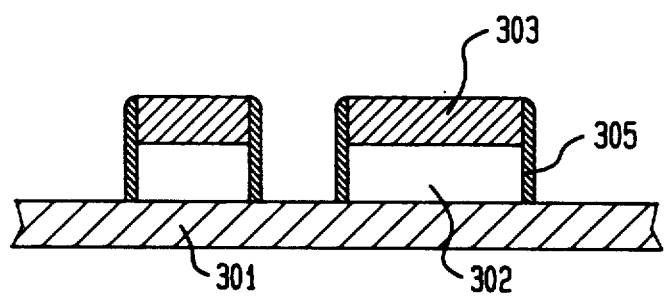

FIGS. 5(a) to 5(d) are longitudinal sections of the production method according to the second embodiment of the present invention. According to the abovementioned process steps of the first embodiment shown in FIGS. 3(a) and 3(b), as shown in FIGS. 5(a), the second insulation film 305 is formed on the lower layer wiring 302 and the first insulation film 303 over the entire surface of the semiconductor substrate 301 containing the lateral surface.

The second insulation film 305 is etched back with the RIE method. Thereby, as shown in FIG. 5 (b), the second insulation film 305 can be left at the lateral wall of the lower layer wiring metal 302 and the first insulation film 303, while the film 305 can be removed on the semiconductor substrate 301 and the first insulation film 303.

In the following process steps, after the film 306 formed by coating and the third film 307 have been formed in the same way as described above, through holes 308 are made, the upper layer wiring 309 is formed. Thus, the wiring structure shown in FIG. 3 is completed.

Since the second insulation film is left only at the lateral portion of the lower layer wiring, it is possible to make the film formed by coating thicker by the thickness corresponding to that of the second film compared to the above-mentioned embodiment thereby to further decrease the wiring capacity.

Further, it is possible to apply a silicon nitride film, which is excellent in resistance to moisture but has a large dielectric constant equal to about 8, to the second insulation film, to suppress the increase of the wiring capacity to the utmost thereby to prevent the wiring metal from corrosion owing to gases caused from the coated film by dehydration condensation reaction, and to form the multilayer wiring having high reliability.

As explained above, the present invention is constituted, by forming selectively a first insulation film on a lower layer wiring metal; after covering a lateral wall of the lower layer wiring metal with second insulation film, embedding a material having a low dielectric constant such as a glass film an organosilicon compound film, a polyimide film and the like in the lower layer wiring so as to flatten the surface thereof; forming a third insulation film over the entire surface; and making through holes in the first and third insulation films on the lower layer wiring thereby connecting the lower layer wiring to an upper layer wiring. Therefore it is possible to realize a layer insulation film having very good flatness, to realize a multilayer wiring having high reliability in which corrosions, etc. are not cause in the wiring metal containing through hole portions, and to make the coated films thicker, which films have a low dielectric constant and can be relatively easily formed, so that the wiring capacity can be decreased.

I claim:

1. A semiconductor integrated circuit comprising:
   (a) a lower layer wiring formed in a predetermined configuration on a semiconductor substrate on which semiconductor elements have been previously formed;
   (b) a first CVD insulation film formed on said lower layer wiring in the same configuration as said lower layer wiring;
   (c) a second CVD insulation film covering at least a lateral portion of said lower layer wiring;
   (d) a film having a low dielectric constant which is formed on the semiconductor subtrate in a region wherein neither the lower layer wiring nor the first CVD insulation film is formed and the surface level of the low dielectric film is substantially equal to the surface level of said first CVD insulation film;
   (e) a third CVD insulation film covering the entire surface above said first CVD insulation film and said low dielectric constant film; and
   (f) an upper layer wiring, formed on the third CVD insulating film, connected to said lower layer wiring through openings which are made, respectively in said first CVD insulation film and said third CVD insulation film on said lower layer wiring.

2. The semiconductor integrated circuit according to claim 1, wherein said CVD insulation film is a silicon oxide film, a silicon nitride film or a silicon oxynitride film, and said film having a low dielectric constant is a silicon glass film, an organosilicon compound film or a polyimide film.

3. A semiconductor device comprising:
   a lower layer wiring having a predetermined configuration on a semiconductor substrate;
   a first insulation film on said lower layer wiring having the same said predetermined configuration;
   a second insulation film covering at least a lateral portion of said lower layer wiring;
   a low dielectric constant film on the semiconductor substrate in a region other than said lower layer wiring and said first insulation film;
   a third insulation film covering said first insulation film and said low dielectric constant film; and
   an upper layer wiring on said third insulating film.

* * * * *